US006628731B2

(12) United States Patent
Auranen et al.

(10) Patent No.: US 6,628,731 B2
(45) Date of Patent: Sep. 30, 2003

(54) METHOD AND APPARATUS FOR CONTROLLING SIGNAL LEVEL IN DIGITAL RECEIVER

(75) Inventors: Tommi Auranen, Turku (FI); Petri Vasenkari, Turku (FI)

(73) Assignee: Nokia Technology GmbH (DE)

(*) Notice: Subject to any disclaimer, the term of this patent is extended or adjusted under 35 U.S.C. 154(b) by 0 days.

(21) Appl. No.: 09/345,819

(22) Filed: Jun. 30, 1999

(65) Prior Publication Data

US 2002/0181623 A1 Dec. 5, 2002

(30) Foreign Application Priority Data

Jul. 1, 1998 (FI) .................................. 981515

(51) Int. Cl.[7] ............................................. H04L 27/08
(52) U.S. Cl. ...................... 375/345; 455/224; 455/232.1
(58) Field of Search ..................... 375/345; 455/224.1, 455/232.1, 224

(56) References Cited

U.S. PATENT DOCUMENTS

| 4,030,035 | A | | 6/1977 | Ienaka et al. |
| 4,786,984 | A | * | 11/1988 | Seeman ........................ 360/31 |
| 5,222,002 | A | * | 6/1993 | Hase et al. .................... 360/39 |
| 5,805,241 | A | * | 9/1998 | Limberg ....................... 329/304 |
| 5,940,143 | A | | 8/1999 | Igarashi et al. |
| 6,002,538 | A | * | 12/1999 | Kanegae et al. ............... 360/46 |
| 6,163,685 | A | * | 12/2000 | Dilling et al. ........... 455/247.1 |

FOREIGN PATENT DOCUMENTS

| EP | 0413311 | 2/1991 | |
| EP | A2 413 311 | 2/1991 | ............ H03G/3/20 |
| EP | 0913934 | 5/1999 | |
| EP | 0940957 | 9/1999 | |
| JP | 10-065471 A | 3/1998 | ............ H03G/3/20 |
| WO | 9853579 | 11/1998 | |

* cited by examiner

*Primary Examiner*—Chi Pham
*Assistant Examiner*—Pankaj Kumar
(74) *Attorney, Agent, or Firm*—Ware, Fressola, Van Der Sluys & Adolphson LLP

(57) ABSTRACT

The invention pertains to a method for controlling the signal level in a digital receiver, wherein the level of a received analog signal is controlled in an analog control circuit (35), whereafter the level of the analog signal coming from the analog control circuit (35) is controlled in a digital control circuit (34), the analog signal is converted into a digital signal in an A/D converter (13) and the amplification factor of the digital control circuit (34) is adjusted on the basis of the signal level of the digital signal coming from the A/D converter (13). The invention also pertains to an apparatus (30) for controlling signal levels in a digital receiver, said apparatus (30) comprising at least an analog control circuit (35) to control the level of an analog signal and a digital control circuit (34) to control the level of the analog signal produced by the analog control circuit (35).

10 Claims, 2 Drawing Sheets

METHOD AND APPARATUS FOR CONTROLLING SIGNAL LEVEL IN DIGITAL RECEIVER

TECHNICAL FIELD

The invention relates to a method for controlling the signal level in a digital receiver. The invention also relates to an apparatus for controlling the signal level in a digital receiver.

BACKGROUND OF THE INVENTION

With various digital receivers, such as digital TV receivers, it is desirable that the digital input signal level be at all times optimal. Due to losses in transmission networks and other non-idealities, real signal levels received from a transmission network may vary a great deal. To level out such variations digital receivers typically are equipped with various signal level control devices which aim at keeping the digital signal level constant regardless of the signal level of the signal received from the transmission network. These systems are generally called automatic gain control (AGC) systems. For example, many demodulator circuit manufacturers are offering circuits with an AGC output that provides a voltage dependent of the signal level of the input signal.

FIG. 1 shows a prior-art arrangement 10 for realizing signal level control in a digital receiver, based on a circuit 14 with an AGC output. The arrangement 10 is based on the use of two successive control loops 11 and 12. A first control circuit 11 controls the signal level of a received analog RF signal and filters by means of a bandpass filter 18 the desired frequency band to be sent forward. A second control loop 12 controls the level of the filtered analog IF signal produced by the first control loop 11. For simplicity, FIG. 1 does not show components, such as mixer elements, which are essential to the operation of the receiver but inessential as regards the operation of the control circuits.

From the second control circuit 12 the analog signal is taken to an A/D converter 13 which converts the analog signal into a digital one. The digital signal thus produced is fed to an AGC circuit 14 which may be a demodulator, for example. The AGC circuit 14 estimates the level of the digital signal coming from the A/D converter 13 and produces an AGC signal 19 proportional to the signal level. Since variable gain amplifiers usually are controlled using an analog signal, the AGC signal has to be D/A-converted. This can be advantageously realized internally in the AGC circuit 14 so that the AGC circuit 14 directly produces an analog AGC signal 19 or, if the circuit 14 has no D/A converter, in a separate D/A converter circuit (not shown). The AGC signal 19 is taken direct to a variable-gain amplifier 16 in the second control circuit 12 and via a threshold circuit 17 to a variable-gain amplifier 15 in the first control circuit 11.

FIG. 2 is a graph illustrating how the level of the analog signal, which is produced by the second control circuit 12 in the arrangement 10 according to FIG. 1 and fed to an A/D converter 13, affects the second control signal (IF Gain) controlling an amplifier 16 in the second control circuit and on the first control signal (RF Gain) following the threshold circuit 17 and controlling an amplifier 15 in the first control circuit 11. Stepwise dependence of amplification factors on the value of the analog signal is the result of quantization noise caused by the limited conversion accuracy of the D/A converter in the AGC circuit 14 or separate D/A converter circuit. Quantization noise is caused by the fact that digital apparatus only have a limited number of bits at their disposal so that the smallest possible adjustment step that can be achieved with digital systems equals the operating range divided by the number of bit combinations available. For example, a one-volt control range in an 8-bit system (256 bit combinations) produces a smallest possible adjustment step of about 4 mV (1 V/256).

In the example depicted in FIG. 2 the system is specified such that when the level of the analog signal coming from the second control circuit 12 is at its minimum, both amplification factors are at their maximum. The behavior of the amplification factors may be realized in other ways, too. When signal levels start to rise in the example depicted in FIG. 2, the amplification factor (IF Gain) of only the second control circuit 12 is reduced at first. The reduction of the amplification factor (RF Gain) of the first control circuit 11 is begun only when the signal level exceeds a certain threshold level 21 defined by means of a threshold circuit 17. This arrangement produces a noise performance which is optimal for the system whole.

Since the values of the amplification factors may vary greatly in an arrangement such as the one described above, the control range also needs to be wide. As the D/A conversion is realized using a limited number of bits, it subsequently follows that the control system always includes quantization noise which degrades the quality of the signal available by preventing accurate signal level control.

A solution obvious to a person skilled in the art for the prior-art quantization noise problem described above is to increase the number of bits available. In the simplest case this would require more accurate circuits, i.e. circuits with more bits, to perform the D/A conversion. AGC circuits with more accurate D/A converters are considerably more expensive as well as more limited in variety than the most common circuits used currently. In the ideal case the user could design and build a circuit with the necessary characteristics but then the unit price of the circuit would be significantly higher.

Another disadvantage of the prior art described above is the system's sensitivity to disturbances. As the AGC signal 19 is used for directly controlling the amplifier 16 in the second control circuit 12, it is possible that a small spurious signal may cause the digital control system to oscillate between two or more amplification values such that the oscillation continues even after the spurious signal has disappeared.

A solution obvious to a person skilled in the art for the disturbance-sensitivity of the arrangement according to the prior art would be to attempt to shield the apparatus as effectively as possible against electrical interference by placing it in a grounded metal casing, for example. Such protective systems add to the size and manufacturing costs of the apparatus but will not, however, provide adequate protection e.g. against spurious signals accompanying the received signal.

SUMMARY OF THE INVENTION

An object of this invention is to provide a new method and apparatus for controlling the signal level in a digital receiver, eliminating the above-mentioned disadvantages of the prior art. These objects are achieved by realizing coarse control of signal level by means of an analog control circuit and fine-controlling the resulting signal by means of a digital control circuit which is functionally separate from the analog control circuit.

More specifically, the present invention is a method for controlling signal level in a digital receiver, comprising at least the following steps: an analog signal is received from a transmission network or the like, the level of the received analog signal is controlled in an analog control circuit, whereafter the analog signal is converted to a digital signal in an A/D converter, wherein the level of the analog signal coming from the analog control circuit is controlled in a digital control circuit which is functionally substantially separate from the analog control circuit, and the amplification factor of the digital control circuit is adjusted on the basis of the level of the digital signal coming from the A/D converter.

The present invention is also an apparatus for controlling signal levels in a digital receiver, comprising at least an analog control circuit for controlling the level of an analog signal, wherein the apparatus includes a digital control circuit, which is functionally substantially separate from the analog control circuit, for controlling the level of the analog signal coming from the analog control circuit.

Compared to the prior art, an advantage of the invention is better interference tolerance as spurious signals of short duration will not bring the control system according to the invention into long-lasting oscillations possible in the arrangement according to the prior art.

Another advantage of the arrangement according to the invention, compared to the prior art, is lower quantization noise, which improves the quality of the digital signal available.

BRIEF DESCRIPTION OF THE DRAWINGS

The invention will now be described in more detail with reference to the accompanying drawing wherein.

BEST MODE FOR CARRYING OUT THE INVENTION

Figure 1:
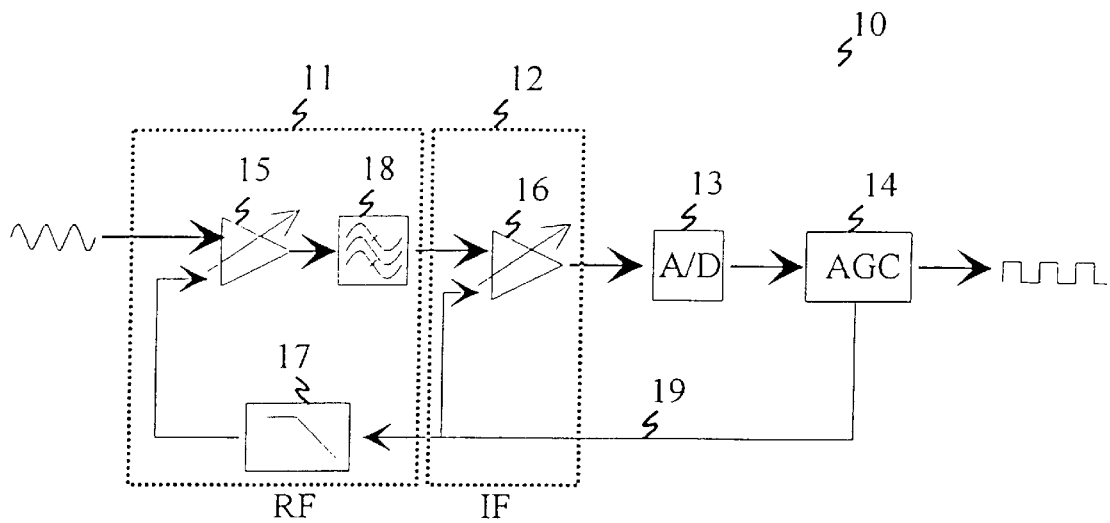
FIG. 1 shows a prior-art two-stage control system for controlling the signal level in a digital receiver.
Figure 2:
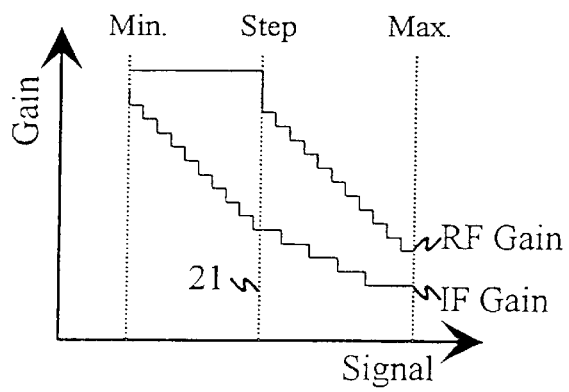
FIG. 2 shows how the amplification factors of the first and second control circuits depend on the analog signal level.

FIGS. 1 and 2 were discussed above in connection with the description of the prior art.

Figure 3:
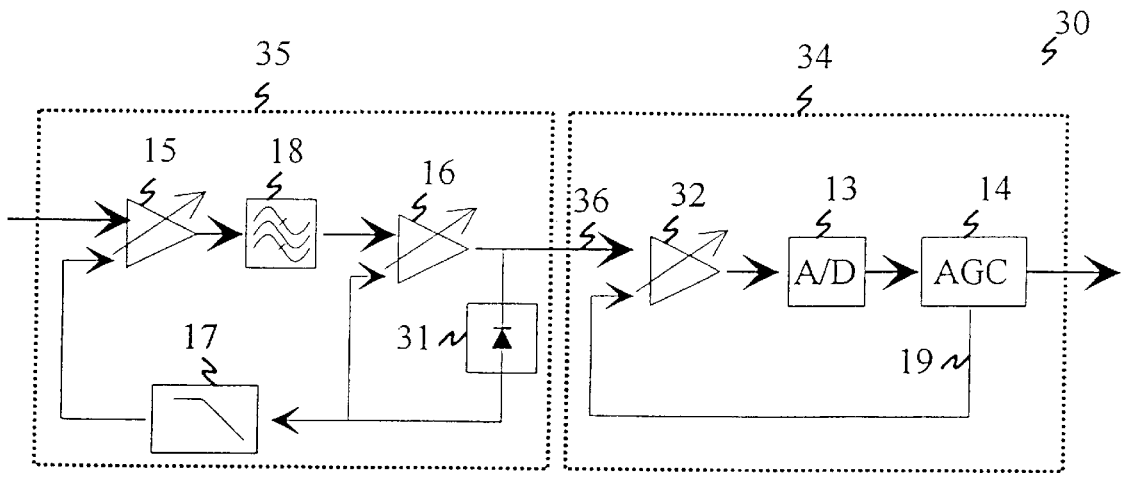
FIG. 3 shows an apparatus according to the invention for controlling the signal level in a digital receiver.

FIG. 3 shows an apparatus 30 according to the invention for controlling the signal level in a digital receiver. The apparatus 30 comprises an analog control circuit 35, which can be realized in many known ways, and a digital control circuit 34 which is functionally separate from the analog control circuit 35 and is used for controlling the level of the signal coming from the analog control circuit 35 such that it is optimal for further processing of the signal.

In FIG. 3, the analog control circuit 35 is realized in a known manner in which the AGC circuit in the above-described prior-art arrangement based on two control circuits is replaced by a peak value detector 31 operating at baseband frequency and the signal from said peak value detector is used as a control signal for controlling the amplifiers 15 and 16 in the analog control circuit 35. The analog control circuit 35 attempts to compensate for deviations in the received analog signal such that the signal level of the signal 36 at the output of the analog control circuit 35 stays constant.

In the digital control circuit 34 the analog signal 36 from the analog control circuit 35 is first taken to a third amplifier 32 in which the signal level is fine-tuned such that it is optimal for further processing of the signal. From the third amplifier 32 the signal is taken to an A/D converter 13 in which the analog signal is made digital. From the A/D converter the digital signal is taken to an AGC circuit 14, which may be e.g. a digital demodulator or the like, and further to the digital apparatus proper, the detailed implementation of which is inessential as regards the present invention. The AGC signal 19, which is proportional to the level of the digital signal coming to the AGC circuit 14 and converted analog e.g. by means of a D/A circuit (not shown), which is either internal to the AGC circuit 14 or a separate circuit, is connected to the control input of the third amplifier 32.

The digital control circuit 34 is used for fine-tuning the level of the analog signal coming from the analog control circuit 35 using a control range which is narrow compared to the signal level. This is possible as the coarse control of the analog signal is carried out in the analog control circuit 35 so that the arrangement according to the invention can have a control range narrower than the prior art with the same number of bits. As a result, adjacent control values are closer to each other, which means shorter adjustment steps, which shows in the curves of FIG. 2 as lower steps, corresponding to a reduction of quantization noise in the apparatus.

The arrangement according to the invention also reduces the sensitivity of the apparatus to disturbances, as compared to the prior art, because as the analog control circuit 35 and digital control circuit 34 are separate, the whole control system will not start oscillating in a situation where the digital control circuit 34 starts to oscillate. As the control range of the digital control circuit 34 is narrower than in the prior art, it follows that oscillation of the digital control circuit 34 causes less level fluctuation in the output signal level than in the prior art in situations where the digital control circuit 34 oscillates.

In addition, it is substantially less likely than in the prior art that the digital control circuit 34 starts to oscillate since in the arrangement according to the invention the gradient of control of the digital control circuit 35 is significantly less steep than in the arrangement according to the prior art, due to the narrower control range. It is known that systems with steep control gradients are more susceptible to oscillation than systems with low control gradients.

Furthermore, the tolerance for disturbances of the system according to the invention can be improved from the prior art by using long time constants in the analog control circuit 35 so that possible spurious signals of short duration accompanying the received signal can be prevented from entering the digital control circuit 34. The arrangement according to the prior art must use short time constants because typical AGC-signal-producing circuits require fast signal fluctuations in order to function reliably.

In accordance with the invention, the functionally separate analog and digital control circuits 35 and 34 may be physically in one and the same unit or they can be placed in separate units equipped with a connection between them to enable signal flow. In the latter case it is possible to use commercially available ready-made analog control circuits, for example. This facilitates advantageous implementation of the solution.

Figure 4:
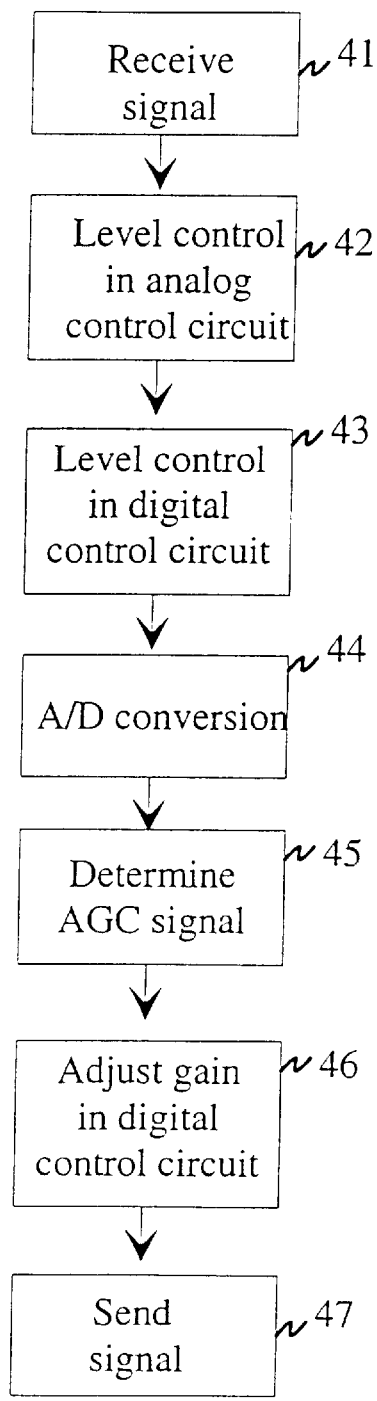
FIG. 4 shows in the form of block diagram a method for controlling the signal level in a digital receiver according to the invention.

FIG. 4 shows a flow diagram 40 of a method according to the invention. In the first step 41 of the method a signal is received from a transmission network or the like. In the second step 42 of the method the level of the received analog signal is controlled using an analog control circuit. In the third step 43 of the method the level of the signal coming from the analog control circuit is controlled, according to the circuit's current amplification factor, by an amplifier in a digital control circuit functionally separated from the analog control circuit. In the fourth step 44 of the method the analog signal is converted to a digital signal in an A/D converter in the digital control circuit. In the fifth step 45 of the method a control signal proportional to the signal level is derived, e.g. by means of an AGC circuit, from the digital signal produced by the A/D converter. In the sixth step 46 of the method the amplification factor of the digital control circuit is adjusted on the basis of the control signal derived in the fifth step 45. In the seventh step 47 of the method the digital signal, the signal level of which has been fine-controlled, is sent forward for further processing.

The arrangement according to the invention is not limited to the examples described above but may vary within the scope of the invention defined by the claims set forth below.

What is claimed is:

1. A method (40) for controlling signal level in a digital receiver, comprising at least the following steps:

amplifying an analog signal conveying digitally encoded information to be provided by the digital receiver as the output of the digital receiver, the amplifying using a first amplifier (15) of an analog circuit (35) so as to provide an amplified analog signal, providing an output analog signal (36) derived from the amplified analog signal while controlling (42) the level of the output analog signal (36), converting (44) the output analog signal (36) to a digital signal in an A/D converter (13) of a digital control circuit (34), and deriving (46) the output of the digital receiver from the digital signal, characterized in that in controlling (42) the level of the output analog signal (36), the output analog signal is tapped to provide an input to a control element (31) provided as a component separate from the digital control circuit (36), the control element (31) for providing to the first amplifier (15) a signal derived exclusively from the peak value of the output analog signal (36).

2. The method (40) of claim 1, further characterized in that the amplification factor of the digital control circuit (34) is adjusted (46) on the basis of the level of the digital signal coming from the A/D converter (13), and further in that said amplification factor of the digital control circuit (34) is adjusted (46) by means of an automatic gain control signal (19) produced by an AGC circuit (13) located in the digital control circuit (34).

3. The method (40) of claim 1, characterized in that the level control range of said digital control circuit (34) is small compared to the signal level of the output analog signal (36).

4. The method of claim 1, further characterized in that in controlling the level of the output analog signal (36) a peak detector (31) is used to determine the peak value of the output analog signal (36) which is then provided to a threshold detector (17) which in turn provides an input to the first amplifier (15).

5. An apparatus (30) for controlling signal levels in a digital receiver, comprising at least an analog control circuit (35) for controlling the level of an output analog signal (36) derived from an analog signal applied to a first amplifier (15), the analog signal conveying digitally encoded information to be provided by the digital receiver as the output of the digital receiver, characterized in that the apparatus (30) also includes a digital control circuit (34) responsive exclusively to the output analog signal (36), the digital control circuit (34) for providing a digital signal from which the output of the digital receiver is derived, further characterized in that the analog control circuit (35) includes means (31 17) for controlling the level of the output analog signal (36) based on the output of a peak detector (31) not included in the digital control circuit (34) and responsive exclusively to a tap of the output analog signal (36) and providing as its output a signal derived exclusively from the peak value of the output analog signal (36), and further characterized in that the means (31 17) for controlling the level of the output analog signal (36) comprises the peak detector (31) in combination with a threshold detector (17), the output of the peak detector (31) being used to provide an input signal for the threshold detector (17) which in turn provides an input signal for the first amplifier (15).

6. The apparatus (30) of claim 5, wherein the digital control circuit (34) comprises at least an A/D converter (13) for converting a signal derived from the output analog signal (36) to a digital signal and means (14) for measuring the signal level of the digital signal, and wherein the digital control circuit (34) comprises means (14) for determining the amplification factor on the basis of the measured digital signal level and amplification means (32) for adjusting the level of the signal derived from the output analog signal (36) in accordance with the amplification factor determined.

7. The apparatus (30) of claim 6, characterized in that the level control range of the amplification means (32) is small compared to the signal level of the output analog signal (36).

8. An apparatus for controlling signal level in a digital receiver, comprising:

means for amplifying an analog signal conveying digitally encoded information to be provided by the digital receiver as the output of the digital receiver, the amplifying using a first amplifier (15) of an analog circuit (35) so as to provide an amplified analog signal;

means for providing an output analog signal (36) derived from the amplified analog signal while controlling (42) the level of the output analog signal (36);

means for converting (44) the output analog signal (36) to a digital signal in an A/D converter (13) of a digital control circuit (34); and means for deriving (46) the output of the digital receiver from the digital signal;

characterized in that the apparatus further comprises:

a control element (31) provided as a component separate from the digital control circuit (36), the control element (31) having as an input a tap of the output analog signal (36), the control element (31) providing to the first amplifier (15) a signal derived exclusively from the peak value of the output analog signal (36) for use in controlling the level of the output analog signal (36).

9. The apparatus of claim 8, further characterized in that the amplification factor of the digital control circuit (34) is adjusted (46) on the basis of the level of the digital signal coming from the A/D converter (13), and further in that said amplification factor of the digital control circuit (34) is adjusted (46) by means of an automatic gain control signal (19) produced by an AGC circuit (13) located in the digital control circuit (34).

10. The apparatus of claim 8, characterized in that the level control range of said digital control circuit (34) is small compared to the signal level of the output analog signal (36).

* * * * *